United States Patent
Carroll et al.

Patent Number: 5,625,327
Date of Patent: Apr. 29, 1997

[54] MODIFIED COLPITTS OSCILLATOR FOR DRIVING AN ANTENNA COIL AND GENERATING A CLOCK SIGNAL

[75] Inventors: Gary T. Carroll, Boulder; J. Donald Pauley, Estes Park, both of Colo.

[73] Assignee: GnuCo Technology Corporation, Boulder, Colo.

[21] Appl. No.: 502,313

[22] Filed: Jul. 13, 1995

[51] Int. Cl.$^6$ .................................................. H03B 5/12
[52] U.S. Cl. ........................ 331/74; 331/117 R; 331/168
[58] Field of Search ............................... 331/74, 117 R, 331/117 FE, 167, 168

[56] References Cited

U.S. PATENT DOCUMENTS

| | | | |
|---|---|---|---|
| 3,534,294 | 10/1970 | Auer | 331/117 FE |
| 3,859,624 | 1/1975 | Kriofsky et al. | 340/152 T |
| 3,878,528 | 4/1975 | Majeau | 343/6.5 SS |
| 3,918,057 | 11/1975 | Van Tol | 342/51 |
| 4,095,214 | 6/1978 | Minasy | 340/258 |
| 4,129,855 | 12/1978 | Rodrian | 340/152 T |
| 4,354,099 | 10/1982 | Rayment et al. | 235/449 |
| 4,475,481 | 10/1984 | Carroll | 119/51 R |
| 4,549,264 | 10/1985 | Carroll et al. | 364/406 |
| 4,724,427 | 2/1988 | Carroll | 342/44 |
| 4,739,328 | 4/1988 | Koelle et al. | 342/44 |
| 4,857,893 | 8/1989 | Carroll | 340/572 |
| 4,893,118 | 1/1990 | Lewiner et al. | 340/825.54 |
| 5,235,326 | 8/1993 | Beigel et al. | 340/825.54 |
| 5,266,926 | 11/1993 | Beigel | 340/572 |
| 5,347,263 | 9/1994 | Carroll et al. | 340/572 |

*Primary Examiner*—Siegfried H. Grimm
*Attorney, Agent, or Firm*—Fitch, Even, Tabin & Flannery

[57] ABSTRACT

A Colpitts-type oscillator circuit suitable for use with electronic identification systems is disclosed. The oscillator circuit utilizes a pair of transistors coupled together with a feedback loop that includes a parallel LC circuit such that the output amplitude can be as high as a factor of 20 times the supply voltage or more while maintaining a high Q, low distortion output. The oscillator circuit is a modified Colpitts oscillator that includes a NPN transistor and a PNP transistor coupled together and a Colpitts type feedback loop containing a parallel LC circuit. The capacitance of the parallel LC circuit consists of at least two capacitors in series forming a capacitive divider which provides a low impedance feedback via the base of the NPN transistor into the emitter of the PNP transistor. The collector of the PNP transistor taps into the inductor of the parallel LC circuit such that the inductor is driven to resonance.

12 Claims, 5 Drawing Sheets

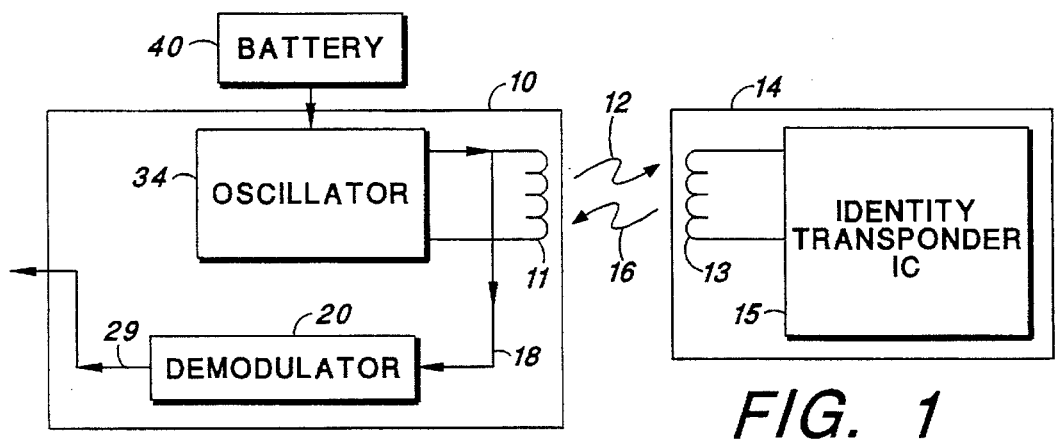
FIG. 1
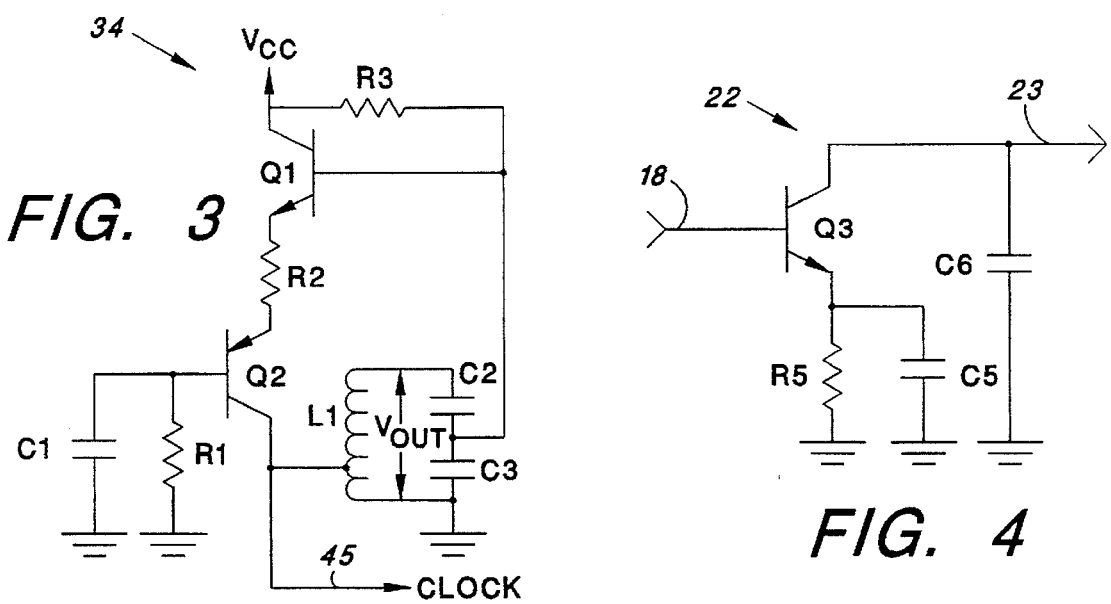
FIG. 3
FIG. 4
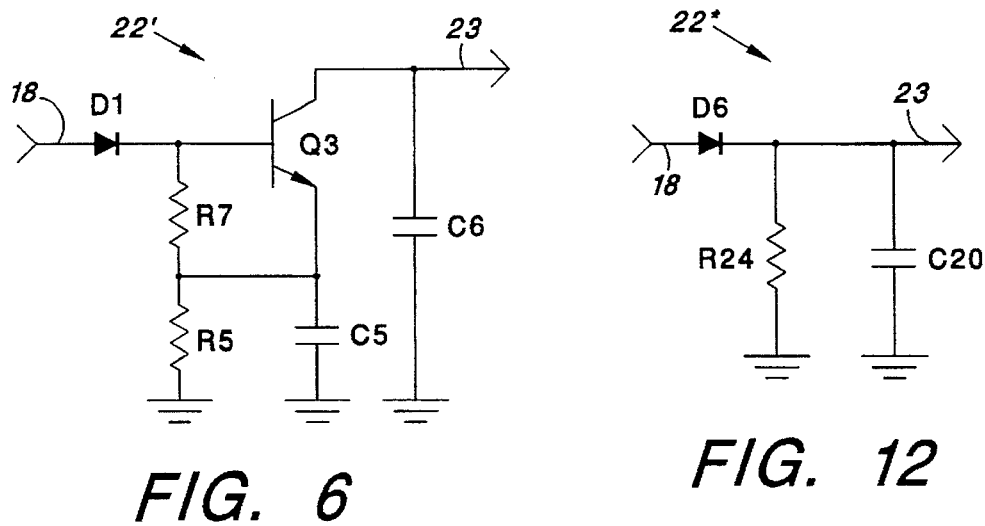
FIG. 6
FIG. 12

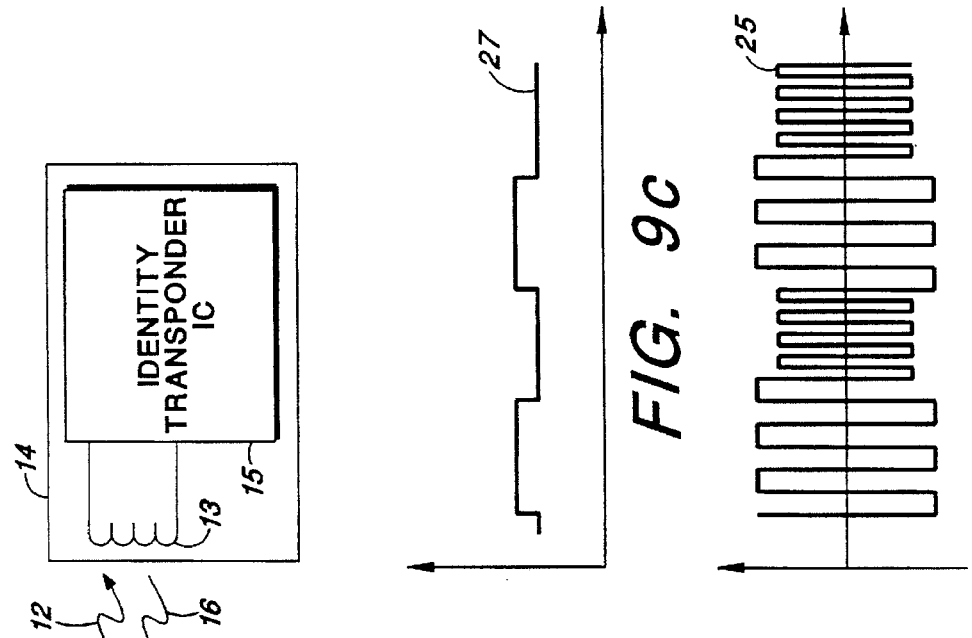
FIG. 9c
FIG. 9b
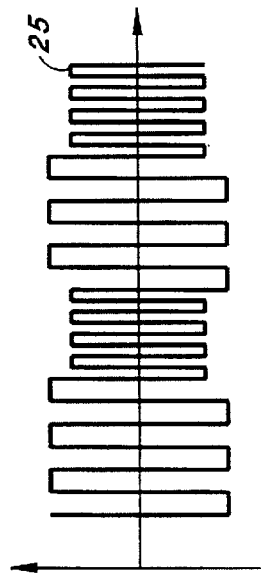
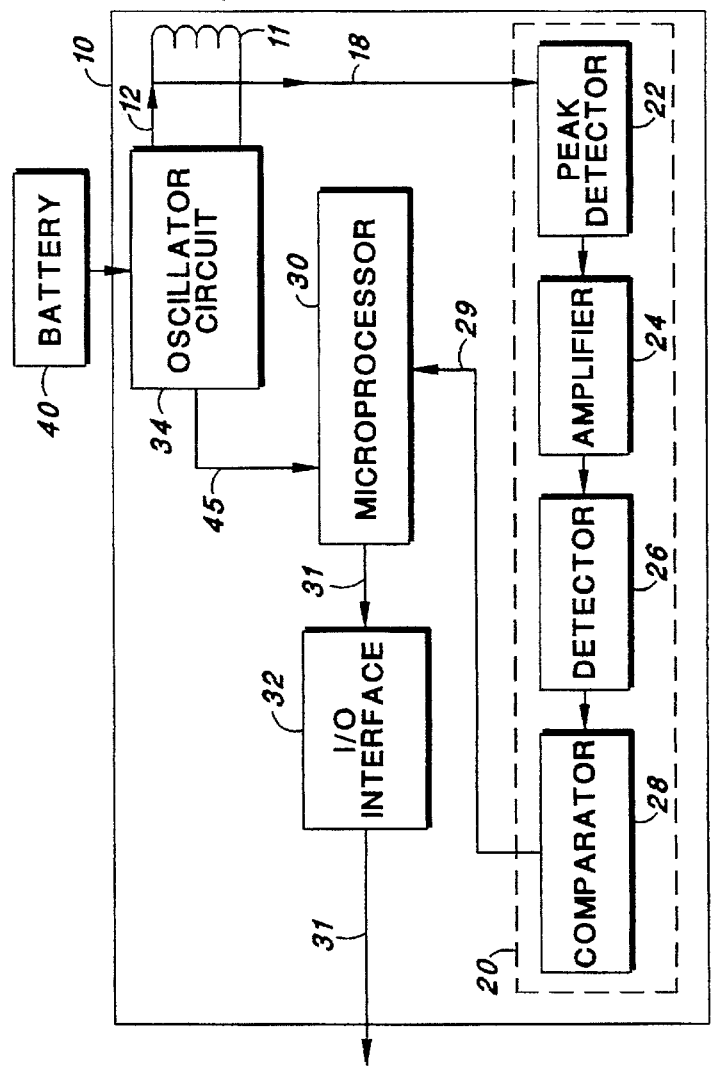
FIG. 2
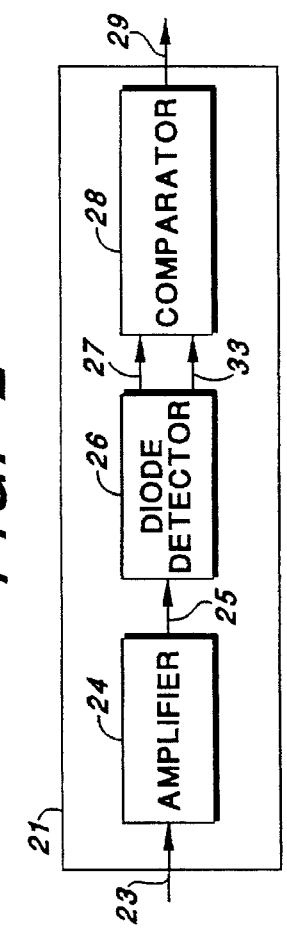
FIG. 8

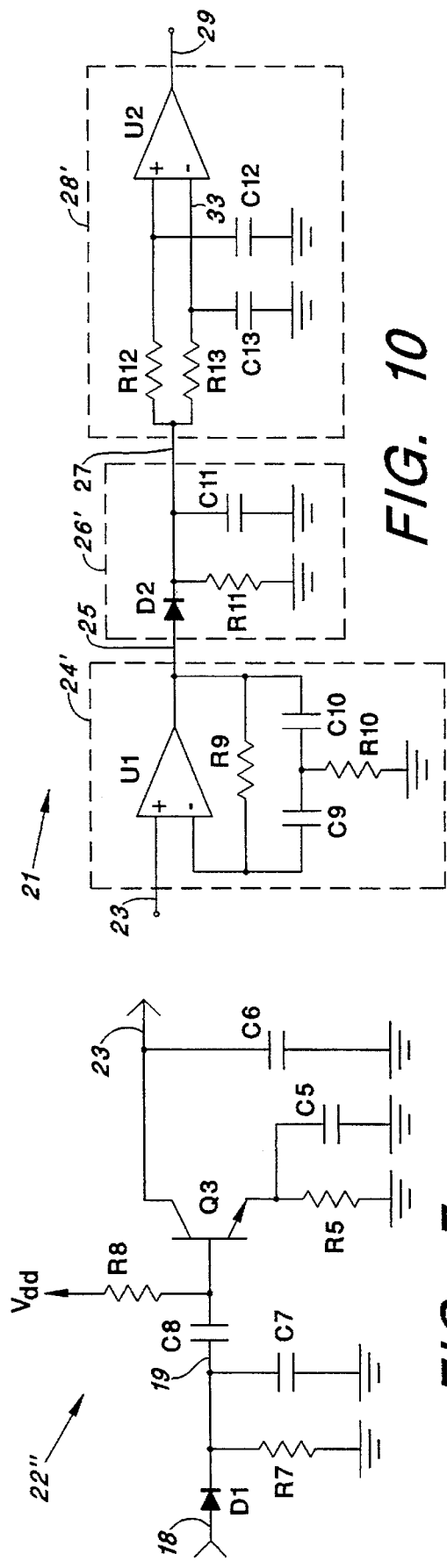
FIG. 10
FIG. 9d
FIG. 9a
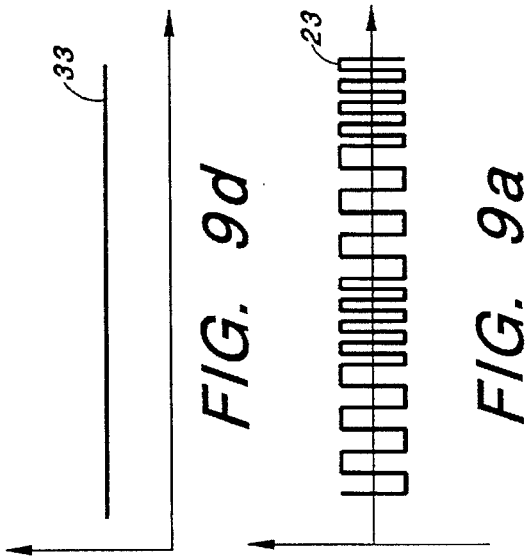
FIG. 7
FIG. 9e

MODIFIED COLPITTS OSCILLATOR FOR DRIVING AN ANTENNA COIL AND GENERATING A CLOCK SIGNAL

BACKGROUND OF THE INVENTION

The present invention relates to a simple oscillator circuit for use in electronic identification devices that provides a high Q, low distortion output, and does so without the use of a crystal or ceramic resonator.

Identification devices and systems are known in the art. See, e.g., U.S. Pat. Nos. 3,859,624; 3,878,528; 4,095,214; 4,129,855; 4,354,099; 4,475,481; 4,549,264; and 4,739,328. Typically, such devices and systems are used for (1) access control, (2) animal feeding and animal health, (3) inventory control, (4) process control, and/or (5) theft/security applications.

Many of the aforementioned identification systems include: (1) a transponder that transmits a unique identification signal; and (2) an identifier that interrogates the transponder, then receives and decodes the identification signal. The transponders are typically small, inexpensive, devices that perform the dedicated function of generating and transmitting their unique identification signal. The transponders are placed on, or carried by, objects, animals, or persons that are to be identified. The identifiers are placed at or near a location where an identification is to be made. Hence, when an object, animal, or person carrying a transponder comes near an identifier, the identifier is able to interrogate the transponder and trigger the generation of the identification signal, receive the identification signal, and decode the identification signal so as to identify the particular object, animal, or person to which the transponder has been attached. In response to making such a valid identification, the identifier may then generate appropriate control signals that carry out a desired function, e.g., the unlocking of a door, the dispensing of a prescribed amount of food, the turning on of a video camera or audio recorder, the time logging of the identification signal, the enabling of a piece of machinery, and the like.

Some identification systems may utilize a transmitter to generate the identification signal, as opposed to a transponder. In such instances, the transmitter periodically generates and transmits the identification signal, e.g., once every 10 seconds, regardless of whether the transmitter is near an identifier. However, the identification signal is of limited range, so the identification signal is only received by the identifier when the transmitter is in close proximity thereto.

The present invention relates primarily to the identifier device or apparatus. Equipment typically used to perform the function of the identifier apparatus in an electronic identification system is generally one of two types. A first type is a "portable" identifier used to read transponders on animals, packages, or people. Such portable identifier typically is about the size of a clothing iron, and may weigh several pounds. Some older portable identifiers or readers are much larger, and are so bulky that they must be placed on a strap and hung over the shoulder of a user. But even when only the size of a clothing iron, the carrying and positioning of such identifier apparatus can become tiring and burdensome. Thus, there is a need in the art for a smaller, more compact, and light weight identifier device.

The second type of identifier device used in the art is a "stationary" identifier, typically permanently housed in a box mounted on a wall or door, and used to read a transponder-type security badge. In most cases, in order to keep the size of the box small and unobtrusive, an antenna and a minimum amount of circuitry is housed in the box, while the remaining circuitry is housed in another (usually hidden) box mounted in the ceiling or elsewhere. The separating of the circuitry between two or more boxes in this manner results in increased expense, maintenance and circuit complexity.

A more recent electronic identification apparatus is disclosed in U.S. Pat. No. 5,347,263 issued on Sep. 13, 1994 to inventor-applicants Gary Carroll and J. Donald Pauley. This simple, low-cost electronic identification system provides a reader or identifier that includes an antenna coil, a single chip microcontroller with a low cost ceramic resonator or crystal connected directly to the antenna coil, a peak detection circuit connected to the antenna coil, a band pass amplifier connected to the peak detector or other demodulator circuit, and an I/O interface circuit connected to the single chip microcontroller.

In this related art system, the single chip microcontroller is adapted to generate a power output signal or interrogation signal that is applied to the antenna coil. The microcontroller is also adapted to decode any identification signal that is received by the system through the antenna coil, demodulator circuit, and band pass amplifier so as to identify the particular object, animal, or person to which the transponder has been attached.

While the system described in the '263 patent has advantageously provided an electronic identification apparatus having very few parts and can thus be made relatively inexpensively and compactly, it requires a higher speed, larger memory microprocessor to perform all of the required decoding and signal generating functions within the short response time demanded by many electronic identification applications. Furthermore, the '263 patented device requires a crystal or other resonating device to clock the microprocessor and synchronize the system.

Also seen in the '263 patent, the decoding function of electronic identifiers typically involves some sort of amplitude demodulation. In the related art systems, it is necessary to extract the identification signal returned from the transponder from the power signal. This extraction may be accomplished through amplitude demodulation wherein the identifier unit often includes a peak detector circuit and a multiplicity of filters in order to accurately extract the modulated signal from the power carrier. Peak detector circuits have been known for quite some time and used extensively in radio receivers to recover amplitude variations from an incoming carrier signal. Most conventional peak detector circuits are diode based peak detector circuits that comprise a specific arrangement of diodes, capacitors, resistors, comparators, re-set switches, etc., which hold the positive peak or negative peak or both of the input voltage on a peak detecting capacitor.

Alternatively, electronic identification systems are built which utilize elaborate inductor-capacitor filter designs without a peak detector circuit to separate the desired signal (of one frequency) from the wide spectrum of frequencies present in the carrier signal. Still other designs of electronic identification systems use conventional peak detectors along with less elaborate filters such as a multi-stage band pass amplifier.

What is thus needed is a small identifier device that can perform all the decoding and signal generating functions needed by electronic identification devices using inexpensive circuitry that does not require the use of a costly crystal or ceramic resonator, and that can also utilize a relatively low cost microprocessor.

There is also a need for a simple and inexpensive means for providing the interrogation signal generation function and to clock the microprocessor in electronic identification devices with relatively low distortion and with a high ratio of energy stored to energy dissipated and radiated by the antenna coil so that the electronic identification device is less likely to be affected by lossy surroundings.

Finally, there is also a need for a simple and inexpensive means for extracting or recovering identification signals that are modulated at very low modulation levels and/or at relatively low frequency ratios, with respect to the interrogation or carrier signal frequency, in order to minimize the need for elaborate filtering techniques.

SUMMARY OF THE INVENTION

The present invention advantageously addresses the above and other needs by providing an electronic identifier device that utilizes a very simple, low cost microprocessor coupled with simple and inexpensive circuits to perform the carrier signal generation, identification signal recovery, and identification signal demodulation functions that normally require more expensive components and complex circuits. In many respects, the present invention represents an improvement over the inventor-applicant's prior designs described in U.S. Pat. No. 5,347,263. The '263 patent disclosure is incorporated herein by reference.

In accordance with one aspect of the invention, electronic identifier apparatus is provided that interrogates a passive or active transponder. The identifier apparatus not only interrogates the transponder for its identification signal, but also powers it if the transponder is passive. Interrogation is achieved by generating a power carrier or interrogation signal that is appropriately modulated so as to not only provide operating power to the transponder, if needed (i.e., for a passive transponder), but also to synchronize the operation of the transponder. The carrier frequency is preferably generated by a simple oscillator circuit, the output of which is a low distortion signal coupled to an antenna coil for transmission to the transponder unit. Advantageously, the low distortion signal is also adapted to clock the microprocessor of the identifier apparatus.

In response to being interrogated, the transponder generates and transmits a unique identification data signal. The identification data signal is received and decoded by the identifier apparatus in the presence of the power carrier signal (which power carrier signal, for purposes of receiving and decoding the identification data signal, may be considered as "noise"). Preferably, the identification data signal is a modulated signal received by the antenna coil and then demodulated with an enhanced peak detector circuit, coupled with a simple band pass amplifier, a detector, and a comparator that produces a digital decoded data bit stream for the microprocessor.

The simplified electronic identifier design of the present invention utilizes novel yet inexpensive modifications of existing circuits to create a carrier frequency external to the microprocessor, as well as to decode the amplitude modulated (AM), Frequency Shift Keyed (FSK), or Phase Shift Keyed (PSK) signals received from the transponder as the identification data signal prior to sending the data decoded therefrom to the microprocessor. Because the microprocessor does not have to perform the data decoding functions, the processing demands on the microprocessor are reduced, and the use of lower cost microprocessors is feasible without sacrificing some of the advantages offered with the use of the single chip microprocessor. In particular, the present design of the electronic identification apparatus eliminates the need for expensive microprocessors due to the lower memory requirements and reduced microprocessor speed requirements. In addition expensive components such as crystals or resonators, as well as other complex circuitry that have heretofore been necessary in electronic identifier devices can be omitted. Thus, the present invention not only provides an identifier device at a much lower cost than has heretofore been achievable, but also provides an identifier device having an improved reliability due to a relatively low number of parts.

In accordance with another aspect of the invention, the electronic identifier apparatus of the present invention may be characterized by what it does not include, rather than by what it does include. It does not include, for example, an expensive microprocessor capable of fast, expensive signal processing. It does not include a crystal to define a precise clock frequency. It does not include elaborate demodulation circuits, nor does it include elaborate filtering schemes or expensive and somewhat bulky and/or heavy inductor circuits to separate the identification signal from the power carrier signal. Yet, with all the invention does not include, it still is able to provide a reliable identifier apparatus that performs all of the functions needed within such a device.

The identifier apparatus of the present invention may be used, e.g., in identification systems adapted for: (1) access control, (2) animal feeding and animal health, (3) inventory control, (4) process control, (5) theft/security applications, and/or any other application requiring a fast, reliable, low cost identifier device. Further, the invention provides a basic, low-cost identifier device that can be easily configured to operate in whatever environment or for whatever application is needed.

An electronic identifier apparatus as thus described may advantageously be used to identify a particular identification signal generated by a particular transponder unit. The transponder unit will typically be a small passive device that generates its unique identification signal only when the identifier apparatus is brought in close proximity thereto, thereby allowing the output power signal generated by the identifier to be received by the transponder. Once the transponder unit has been powered, it begins generating its particular identification data signal. Such identification data signal is received at the antenna coil of the identifier and is extracted from the power signal also present at the antenna coil. Then, the identification data signal is demodulated, as necessary, and decoded to determine the particular identification data or other information contained therein.

The invention may also be characterized as an electronic identifier apparatus, substantially as described above, that contains only an oscillator circuit for generating the carrier signal frequency; an antenna coil coupled to the oscillator circuit for transmission of the carrier signal to the transponder unit and for receipt of an identification data signal from the transponder unit; and a means for detecting and demodulating the identification data signal transmitted by the antenna coil to produce a digital decoded data bit stream representative of the data/information contained within the identification signal. The detecting and demodulation means preferably comprises an enhanced peak detector circuit coupled with a simple band pass amplifier that extracts the identification signal from the power carrier signal, filters and amplifies the identification data signal to yield an amplitude modulated signal containing the data/information from the transponder unit. This amplitude modulated signal can be further demodulated using a simple diode detector and comparator to produce a digital decoded data bit stream.

Advantageously, such electronic identifier apparatus is realized using very few parts and can thus be made relatively inexpensively and compactly.

Further, the invention may also be characterized as a method of electronically identifying a particular transponder unit. The particular transponder unit to be identified has circuitry that transmits an assigned identification signal upon being powered from an external source. The method includes the steps of: (a) generating a carrier signal of a prescribed carrier frequency with a low cost oscillator circuit that includes an antenna coil, whereby the carrier signal is applied directly to the antenna coil at a resonant frequency determined by the antenna inductance and a resonating capacitor(s), and wherein a current flows through the antenna coil that, because of the resonance, is more or less sinusoidal; (b) positioning the antenna coil within about 2 to 10 cm of the transponder unit so that power may be inductively coupled into the transponder unit from the carrier signal, which power is then used by the transponder unit to allow it to transmit its assigned identification signal back to the antenna coil; and (c) demodulating any identification signal transmitted by the transponder unit to produce a digital decoded data bit stream representative of the information contained within the identification signal.

Where the incoming identification signal is a frequency shift keyed (FSK) modulated signal, the demodulation step in the present method further includes: (d) extracting the FSK modulated identification signal from the power signal, both of which are present at the antenna coil; (e) converting the incoming FSK modulated signal to an amplitude modulated (AM) signal wherein the amplitude modulation is frequency dependent over the range of the FSK modulated frequencies; (f) demodulating the amplitude modulated signal; and (g) comparing the amplitude demodulated signal to a reference signal to produce a digital decoded data bit stream representative of the information contained within the identification signal.

Accordingly, it is an object of the present invention to provide a low cost method and apparatus for electronically identifying a transponder unit.

Another object of the present invention is to provide an electronic identifier device that utilizes simple and inexpensive circuitry with a relatively low cost microprocessor and that does not require a costly crystal or ceramic resonator.

An advantage offered by the improved electronic identification apparatus is that it provides a simple and inexpensive means for extracting or recovering data/identification signals that are modulated at very low modulation levels and at relatively low frequency ratios, with respect to the interrogation or carrier signal frequency.

Another advantage offered by the improved electronic identification apparatus is that it provides a simple and inexpensive means for establishing the optimum interrogation signal frequency without the need for a crystal or ceramic resonator.

A still another advantage offered by the present invention is that it provides a small, identifier device that utilizes a low number of off-the-shelf components, and that may be housed in a single, very small, unobtrusive housing. This makes the electronic identifier apparatus suitable for use in applications where the identifier is preferably a hand-held or other transportable unit, or in applications where size restrictions exist.

An important feature of the invention is the relative ease of adapting or customizing the electronic identifier apparatus for use in a wide variety of applications.

Yet another important feature of the invention is the use of low cost components, including a low cost microprocessor, thus making the electronic identifier apparatus relatively inexpensive to manufacture.

BRIEF DESCRIPTION OF THE DRAWINGS

The above and other aspects, features and advantages of the present invention will be more apparent from the following more particular description thereof, presented in conjunction with the following drawings wherein:

FIG. 1 is a general block diagram of an identification system in accordance with the present invention, and illustrates the interaction between an identifier and transponder unit;

FIG. 2 is a detailed block diagram of a preferred embodiment of the identification system;

FIG. 3 is an electrical schematic diagram of the modified Colpitts oscillator circuit used in the present invention;

FIG. 4 is an electrical schematic diagram of the enhanced peak detector circuit used in the present invention;

FIG. 6 is a electrical schematic diagram of another embodiment of the enhanced peak detector circuit adapted for use in high voltage applications;

FIG. 7 is a electrical schematic diagram of still another embodiment of the enhanced peak detector circuit that is particularly useful in circuits where operational amplifiers are used in follow-on stages;

FIG. 8 is a block diagram of the preferred FSK detector circuit used with the present invention;

FIGS. 9a–9e illustrate typical waveforms associated with the FSK detector circuit represented in FIG. 8;

FIG. 10 is an electrical schematic diagram of an embodiment of the FSK detector circuit;

FIG. 12 illustrates an alternative electrical schematic diagram for the peak detector circuit 22 of FIG. 11 that is suitable for some applications of the invention.

Corresponding reference characters indicate corresponding components throughout the several views of the drawings.

DETAILED DESCRIPTION OF THE INVENTION

Figure 5A:
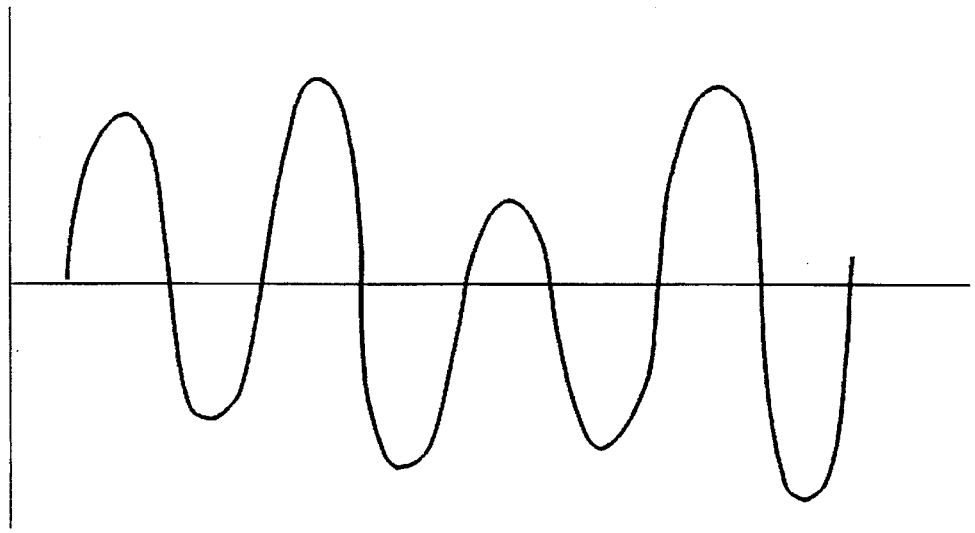
FIGS. 5a–5c illustrate typical waveforms associated with the enhanced peak detector circuit.

The following description is of the best mode presently contemplated for carrying out the invention. This description is not to be taken in a limiting sense, but is made merely for the purpose of describing the general principles of the invention. The scope of the invention should be determined with reference to the claims.

The preferred embodiment of the electronic identification system is shown generally in FIG. 1. Such a system typically includes a transponder 14 and an identifier 10. The transponder 14 is normally a custom integrated circuit 15 combined with a coil 13. The transponder integrated circuit 15 is designed to perform the functions of a rectification, voltage regulation, clocking, addressing, memory, and the logical interconnection of such functions. A representative transponder unit 14 is described, e.g., in U.S. Pat. Nos. 4,724,427 or 4,857,893, both of which are incorporated herein by reference.

The transponder 14 receives power from the power carrier signal 12 and sends back a modulated identification data signal 16 to the identifier 10. The identifier 10 includes an antenna coil 11 adapted to receive the identification signal 16 from the transponder 14 and pass a signal 18 to a demodulator 20 where the identification data signal is extracted and demodulated, producing a decoded and demodulated signal 29. In order for the identifier 10 to recognize the identification data signal as a new signal, it must extract the identification data signal 16 returned from the transponder 14 from the power carrier signal 12 which is also present at the antenna coil 11. The decoded and demodulated signal 29 produced by the demodulator 20 typically takes the form of a digital decoded data bit stream.

Referring next to FIG. 2, a more detailed block diagram of a preferred embodiment of the identification system 10 is shown. As seen in FIG. 2, a low cost microprocessor controller 30 is used to process the data bit stream signal 24 generated by the demodulator 20 in an appropriate manner as controlled by a suitable operating program made available to the microprocessor controller 30. Such processing typically includes comparing the digital decoded data bit stream signal 29 (representative of the detected and demodulated identification data signal) with a library of stored data in the microprocessor memory to determine if the identification signal is assigned to a particular transponder unit, and if so generating a control signal to initiate or perform a desired function. The control signal 31 is sent via an I/O interface 32 to peripheral equipment, where some appropriate action is taken. For example, such action may include, but is not limited to: opening a door, turning on a feeder, triggering an alarm, or enabling a piece of machinery.

Still with reference to FIG. 2, it is seen that the preferred demodulator 20 includes an enhanced peak detector circuit 22, an amplifier circuit 24, a detector circuit 26, and a comparator circuit 28. The demodulator 20 is adapted to extract an incoming modulated identification signal 16 (e.g., FSK modulated) from the signal 18 present at the antenna coil 11. Such extraction is accomplished using the peak detector 22 to first detect the peaks in the signal, which peaks are then amplified by the amplifier 24. The signal is then further processed by the detector 26, and the comparator 28, as explained more fully below, in order to convert the extracted signal to the digital decoded data bit stream signal 29.

An oscillator circuit 34 establishes the frequency of the power carrier signal 12 that is transmitted from the antenna coil 11. As explained above, the carrier signal 12 is coupled to the coil 13 to interrogate the transponder 14 and trigger the generation of the identification/data signal 16.

As further shown in FIG. 2, a suitable source of operating power, such as a battery 40, is either provided as part of the identifier 10, or is external thereto and coupled into the identifier 10 through an appropriate power connection.

The electronic identifier system, as described herein, represents a significant improvement over electronic identification systems known in the art. The advantages and features of the present electronic identification system are most readily appreciated through the improvements made in the individual elements of the system. Such improvements reside primarily in the enhanced peak detector 22, a simplified FSK detector/demodulator circuit 21 (used in a preferred embodiment as explained below), and oscillator circuit 34. Collectively, such improvements provide a compact, inexpensive reliable electronic identifier system that can be adapted or customized for use in a wide variety of applications. Each of these elements or improved subsystems are discussed in more detail in the paragraphs that follow.

Transponder Unit

With reference to FIG. 2, the transponder unit 14 operates by receiving electromagnetic energy, represented in FIG. 2 by the wavy arrow 12, from an antenna coil 11 of the identifier 10. This energy is picked up by the coil 13 connected to the custom integrated circuit 15 of the transponder 14. The coil 13 acts like a secondary winding of a transformer, with the coil 11 acting like the primary winding of the transformer. Thus, energy is coupled from the coil 11 to the coil 13 when such coils are in close proximity to each other. This coupled energy is rectified in the integrated circuit 15 of the transponder 14 and regulated by an internal regulator.

The power carrier signal 12 coupled through the coils 11 and 13 may also provide a clock signal to the transponder integrated circuit. The transponder also includes a memory circuit, typically a read-only memory (ROM) circuit, wherein unique identification data is stored. The circuits of the transponder 14 take the clock signal obtained from the power signal 12 and produce additional synchronized clock and other signals for operation of the transponder logic circuits. In addition, the logic circuits typically divide down the incoming frequency of the power signal to produce a return carrier frequency that becomes an identification signal 16, represented in FIG. 2 by the wavy arrow 16, that is sent back to the identifier 10. The identification signal 16 is modulated with identification data that is uniquely assigned to the particular transponder integrated circuit 15 from which it originates. The identification data is obtained within the transponder unit 14 by using the clock, included in or derived from the power carrier signal 12, to step through the memory addresses of the ROM circuit and send back to the identifier 10 some or all of the data stored in memory, thus providing the identifier 10 with identification data unique to the particular transponder 14.

More sophisticated transponder units 14 may also include means for monitoring certain parameters within the transponder 14, or means for sensing certain conditions associated with the transponder, and including such other monitored or sensed information in the signal 16 that is sent back to the identifier 10. Hence, the signal 16 produced by the transponder may include more than just identification data; it may also include other monitored or sensed data.

Oscillator Circuit

The identifier 10 produces the electromagnetic energy coupled to the transponder by driving current into (or sinking current out of) the antenna coil 11 at its resonant frequency. Heretofore, a large drive circuit has been required to perform this function. The present invention eliminates the need for any such drive circuits by connecting an oscillator circuit 34 which provides a simple and inexpensive means for providing a high amplitude and low distortion power carrier signal 12. As described more fully below, the oscillator circuit 34 connects the antenna coil 11 in parallel with a pair of capacitors which are further connected with a pair of transistors to form a free-running oscillator, e.g., to form a type of free-running Colpitts style oscillator. The use of the second transistor allows the amplitude of the output to be substantially increased as compared, e.g., to a standard single transistor Colpitts oscillator while maintaining a low distortion output. By way of example, the output amplitude of the oscillator can be as high as 20 times that of the supply voltage, or more, while still maintaining a high Q, low distortion output signal.

Being able to produce such a high Q, high amplitude output signal represents a significant advantage because many standard oscillators, e.g., Colpitts oscillators, lack the ability to drive any power into the coil without distorting the waveform. Moreover, the output amplitude from a standard Colpitts oscillator is limited by the quality factor (Q) of the inductor, causing the output waveform to become more distorted as the amplitude of the output is increased.

In addition, the oscillator of the present invention allows the coil-capacitor segment, i.e., the LC circuit, of the oscillator circuit to run at an optimum frequency at all times in spite of nearby metal surfaces or the lack of an inductor having a precise value of inductance. Many related art electronic identification systems have utilized an internal oscillator, such as a crystal coupled to the microprocessor, to produce an electrical current that flows in the coil that is more or less sinusoidal. The crystal is typically used to generate a relatively high oscillator frequency, which is divided down using divider circuits in order to obtain a frequency close to the desired carrier frequency which drives the antenna coil. Such crystal and associated dividing-down circuitry represent additional components which are not needed in the present invention.

A schematic diagram of an example of an oscillator circuit made in accordance with the present invention is shown in FIG. 3. As seen in FIG. 3, a power source or supply, $V_{CC}$, is coupled to the collector of an NPN transistor Q1. The emitter of transistor Q1 is coupled via resistor R2 to the emitter of a PNP transistor Q2. The collector of transistor Q2 taps into an inductor L1 of a parallel LC segment of the oscillator circuit, wherein the inductor L1 represents the antenna coil and the capacitors, C2 and C3, are arranged in series and are adapted to resonate with the coil. The capacitive divider formed by capacitors C2 and C3 also provides a low impedance feedback signal that is applied to the base of transistor Q1. In other words, the base of transistor Q1 is driven from the capacitive divider represented by capacitors C2 and C3. The oscillation circuit 34 further includes a bias segment comprised of capacitor C1 and resistor R1 coupled in parallel to the base of transistor Q2.

The effect of transistor Q1 is to augment the impedance transformation capability of the capacitive divider (capacitors C2 and C3) by the current gain ($\beta$) of the transistor Q1. The transistor Q1 acts much like an emitter follower and thus multiplies the impedance seen at the emitter of transistor Q2 by $[C2/(C1+C2)]^2[\beta+1]$. This provides the oscillation circuit with a higher ratio of energy stored to energy dissipated and radiated, which in turn reduces the distortion in the output signal, $V_{OUT}$ (the signal present across the coil 11), and makes the circuit less likely to cease oscillating in the presence of lossy surroundings such as steel housings or conductive fluids. Alternatively, the tap on inductor L1 can be moved further down the coil, thus increasing the output voltage of the circuit such that the output voltage is much larger than the initial power supply voltage while still maintaining low distortion. The output signal of the oscillation circuit 34 produces an oscillation with a peak-to-peak amplitude that can be, e.g., 20 times greater than the power supply voltage $V_{CC}$ without significant distortion.

It is noted that while the transistors in FIG. 3 are shown as bipolar transistors, with Q2 being a PNP transistor, and Q1 being an NPN transistor, such arrangement is only exemplarary. Transistor Q1 could just as easily be a PNP transistor, with transistor Q2 being an NPN transistor. Moreover, other types of transistors, e.g., field-effect transistors (FET's), including MOSFET transistors, could be used in lieu of bipolar transistors.

Referring back to FIG. 2, it is noted that the oscillator circuit 34 provides the electromagnetic energy 12 that is applied to the antenna coil 11 at its resonant frequency. Such energy creates an electromagnetic field that powers and/or interrogates the transponder 14. The power signal generated by the oscillator circuit 34 may also be used to clock and synchronize the transponder regardless of whether the transponder 14 is an active or passive type. Further, the oscillator 34 provides a clock signal 45 for clocking the microprocessor controller 30, and thus for synchronizing the entire system.

Peak Detector

The peak detector circuit 22 extracts the identification signal 16 from the signal 18 present at the antenna coil 11 by removing most of the carrier energy, leaving mostly the energy of the identification signal 16, and only a little of the carrier energy. The identification signal 16 must be of a lower frequency than the power carrier signal 12. Hence, when these two signals are superimposed at the coil 11, it appears as though the higher frequency power carrier signal 12 is amplitude modulated by the lower frequency identification signal 16. The peak detector circuit 22 thus effectively functions as an AM demodulator circuit, and extracts the lower-frequency identification signal 16 from the higher-frequency power carrier signal 12. It is noted, however, that such "extraction" or demodulation does not remove any additional modulation that may be present on the identification signal 16, which modulation may take numerous forms (e.g., FSK, PSK, or AM), and is used to encode the returned signal with the unique identification data that identifies the transponder.

A schematic diagram of a simple embodiment of the enhanced peak detector circuit 22 is shown in FIG. 4. The enhanced peak detector circuit 22 is realized using a forward biased NPN transistor Q3, with the base-emitter junction acting as a diode and the collector coupled to the detected output 23. A capacitor C5 and resistor R5 are connected in parallel from the emitter of transistor Q3 to ground, while a capacitor C6 is connected from the collector of Q3 to ground.

Figure 5B:
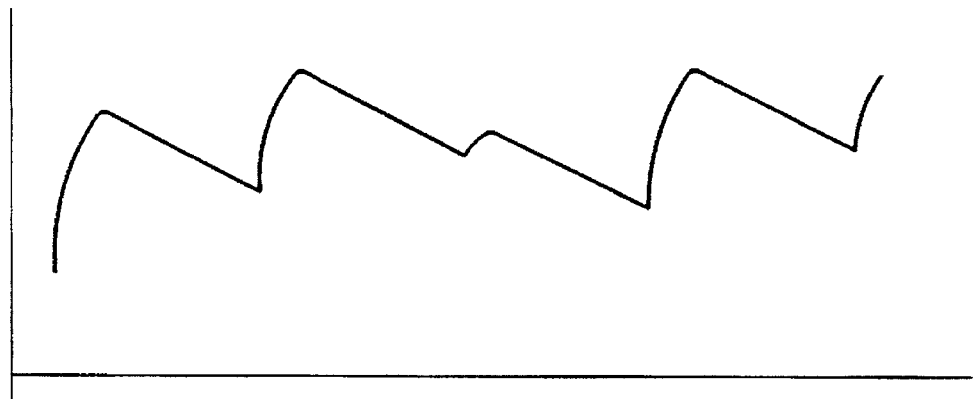
Figure 5C:
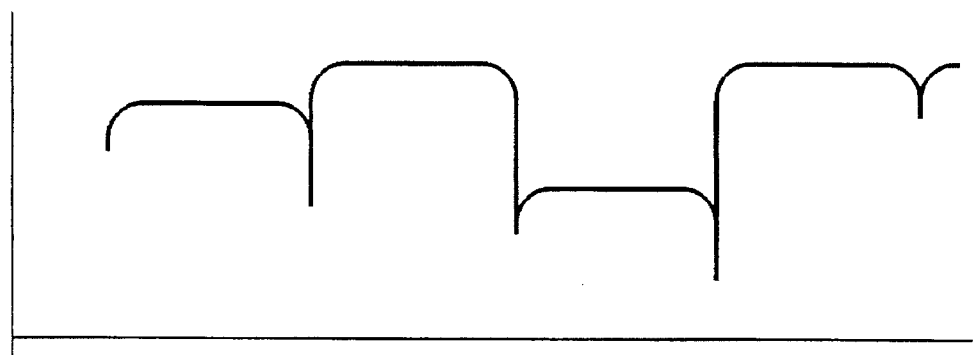

In operation, the signal waveforms associated with the operation of the peak detector circuit 22 are shown in FIGS. 5a, 5b and 5c. The peak detector circuit 22 receives an input combination signal 18, as shown in FIG. 5a, at the base of transistor Q3 containing amplitude variations. When the base-emitter junction of transistor Q3 is conducting, capacitor C5 charges up to the amplitude of the incoming carrier signal. Furthermore, since capacitor C6 is effectively connected in parallel with capacitor C5 and resistor R5 (through the conducting transistor Q3), capacitor C6 also charges up to the amplitude of the incoming carrier so long as the base-emitter junction of transistor Q3 is conducting. As soon as the peak of the incoming carrier begins to recede, however, the base-emitter junction of transistor Q3 becomes back-biased and the collector of Q3 becomes open. Capacitor C5 discharges some prescribed amount through resistor R5 between peaks of the incoming carrier. The signal present at capacitor C5 is representative of the envelope of the incoming signal 18 and further includes some of the incoming signal, harmonics of the incoming signal, and a small DC component. The signal present at the peak detecting segment (i.e., at capacitor C5 and resistor R5) is generally represented in FIG. 5b.

When the collector of Q3 is open, the peak charge remains on capacitor C6 with no discharge path until the next peak brings the base-emitter junction of transistor Q3 back into conduction. As soon as the collector is no longer open, capacitor C6 discharges into resistor R5 and capacitor C5 and then charges up to the new amplitude of the incoming signal 18. As seen in FIG. 5c, the general representation of the peak detector output signal 23 at capacitor C6 thus appears very much like the output of a sample-and-hold circuit, except for a plurality of spikes. These spikes, as well as any DC components, are easily removed with a simple filter circuit connected to the output of the peak detector circuit 22.

The peak detector circuit 22 as described herein is very useful in applications such as an electronic identification system, where the amplitude modulation caused by the reflected signal is at very low levels (i.e., less than 10% of the carrier amplitude) and the frequency of the modulated signal is high (i.e. between 10% and 50% of the frequency of the power carrier). For some applications of RF identification systems, the amplitude modulation of the signal present at the antenna caused by the reflected identification signal is often less than 1% of the carrier amplitude, and the modulation frequency ratios ($f_c/f_r$) range between 10.0 and 2.0.

Referring next to FIG. 6, an alternate embodiment of the enhanced peak detector circuit is illustrated as circuit 22'. The embodiment of FIG. 6 is adapted for use in high voltage applications, and particularly where the incoming combination signal 18 has a peak-to-peak voltage that may be higher than the emitter-base breakdown voltage of the transistor Q3.

As with the previous embodiment, the modified peak detector circuit 22' is also adapted to receive an input combination signal 18 containing amplitude variations (FIG. 5a) and provide an output signal 23 similar to the one shown in FIG. 5c. The peak detector circuit 22' utilizes a forward biased NPN transistor Q3, with the base-emitter junction acting as a diode and the collector being connected to a capacitor C6 that provides the detected output 23. As with the earlier described embodiment, capacitor C5 and resistor R5 function as a peak detecting segment and are connected in parallel from the emitter of the transistor Q3 to ground. The peak holding capacitor C6 is connected between the collector of Q3 and ground. In addition, a diode D1 is placed in series with the base of the transistor Q3 to provide a higher breakdown voltage. Another resistor R7 connected between the diode D1 and the peak detecting segment (R5 and C5) provides a discharge path for the parasitic capacitance of the diode D1. Resistor R7 is typically between 1 k and 10 k ohms.

Still another alternative embodiment of the peak detector circuit 22 is illustrated in FIG. 7 as the circuit 22". This particular embodiment is adapted for use in circuits where operational amplifiers are used in follow-on stages. The embodiment of the peak detector circuit 22" utilizes a conventional diode peak detector coupled to the base of the transistor Q3 through coupling capacitor C8. The conventional diode peak detector consists of a diode D1, placed in series with the parallel combination of capacitor C7 and resistor R7. Such circuit detects the positive peaks of an incoming combination signal 18, as is known in the art. Much like the embodiment shown in FIG. 4, the base-emitter junction of transistor Q3 functions as a diode, with the collector of Q3 providing the detected output. Capacitor C5, in parallel with resistor R5, function as the peak detecting segment, and are connected from the emitter of transistor Q3 to ground. Peak holding capacitor C6 is connected between the collector of Q3 and ground, as previously described. Resistor R8 is connected between the power source, $V_{dd}$, and the base of the transistor Q3. The resistors R5 and R8 bias transistor Q3 on in the absence of a signal 19 from the conventional peak detector coupled to the base.

Thus, the voltage appearing at the collector of Q3 is determined largely by the voltage divider action of resistors R5 and R8. The base-emitter voltage and the collector voltage are used as the bias for the operational amplifiers ("op-amps") used in subsequent stages of filtering and amplification. The base-emitter junction of transistor Q3 coupled with the peak detecting segment (capacitor C5 and resistor R5 in parallel) function as a second peak detector on the signal 19 coming from the conventional peak detector. When the transistor Q3 is conducting, capacitor C5 charges up to the amplitude of the signal 19 coming from the conventional peak detector. Furthermore, since capacitor C6 is effectively connected in parallel with capacitor C5 and resistor R5, capacitor C6 also charges up to the amplitude of the conventional peak detector signal. When the transistor Q3 is not conducting, which is the predominant state, capacitor C6 holds the charge and yields an output signal 23 similar to the waveform shown in FIG. 5c. The peak-to-peak voltage at the base of transistor Q3 is limited to the base-emitter breakdown voltage of transistor Q3, which is typically between 2-6 volts.

Demodulation/Detector Circuit

As indicated above, the type of identification signal coming from the transponder 14 may be modulated in various ways, e.g., AM (amplitude modulation), FSK (frequency shift keyed) modulation or PSK (phase shift keyed) modulation. The type of modulation used by the transponder makes little difference to the electronic identifier apparatus of the present invention. It is common practice, however, to transmit the data or information from a particular transponder by modulating the identification signal using FSK modulation. For example, an electronic identification system may transmit an identification signal that is switched between ⅛ and ⅒ of the carrier frequency, where the carrier frequency is typically between about 125 KHz and 400 KHz. That which follows is a description of a simple FSK detector circuit 21 that demodulates an FSK modulated signal after such signal has been separated from the carrier signal using the enhanced peak detector circuit 22, or equivalent circuit, described above.

Referring to FIG. 8, the preferred detector/demodulator circuit 21 includes an amplifier 24, a diode detector 26, and a comparator 28 coupled together in a manner that utilizes relatively few discrete components. The detector/demodulator circuit 21 is so arranged as to: (a) convert the incoming modulated signal to an amplitude modulated signal corresponding in some predetermined manner to the incoming modulated signal; (b) demodulate the amplitude modulated signal; and (c) convert the amplitude demodulated signal to a digital data bit stream representative of the information contained on the incoming identification signal.

The exact configuration of the detector/demodulator circuit 21 is dependent on the type of modulation used by the various transponder units. For example, where the incoming signal is FSK modulated, an FSK detector circuit which utilizes a frequency dependent active filter is preferred. The operating characteristics of the detector circuit 21 are particularly tailored to the identification frequencies used by the various transponders. Alternatively, where the incoming signal is modulated in accordance with a Phase Shift Keying (PSK) modulation scheme, a suitable PSK detector circuit is used. Such PSK detector circuit must include some means for detecting a significant phase shift (e.g., a phase shift of 180 degrees) in the incoming signal. Typically, this is done by comparing the phase of the incoming signal with the phase of a reference signal of the same frequency. A phase detector circuit suitable for this purpose may be realized, e.g., with an exclusive OR gate.

As indicated, the preferred detector circuit is an FSK detector circuit 21 in which the amplifier 24 is a frequency dependent active filter adapted to receive an FSK modulated input signal 23, generally represented as shown in FIG. 9a, and convert the signal 23 to an amplitude modulated signal. The preferred embodiment produces an output signal 25 from the amplifier 24 that is both amplitude modulated (AM) and FSK modulated as shown in FIG. 9b. The amplifier 24 can be a band-pass amplifier, a low-pass amplifier, a high-pass amplifier, or a band-elimination amplifier with a center frequency chosen such that one of the FSK frequencies of the FSK modulated input signal 23 is amplified more than the other FSK frequency of the FSK modulated input signal 23.

The diode detector 26 is a simple diode peak detector circuit that essentially removes the carrier portion of the AM/FSK modulated signal 25 and produces an output signal 27, shown in FIG. 9c, that is representative of the difference in the positive peaks of the AM/FSK modulated signal. The small output signal 27 of the diode detector 26 is then fed into a comparator 28 which compares the small output signal 27 against a reference signal 33 (See FIG. 9d). A logic level output signal 29 (See FIG. 9e) is then produced that is a digital representation of the information contained within the original input FSK modulated signal.

Advantageously, the described embodiment of the present invention provides the FSK detection/demodulation functions of the demodulator shown in the functional block diagram of FIG. 1, without a phase locked loop (PLL) circuit. The simple and inexpensive FSK detector circuit thus provides a significant savings in terms of expense, circuit complexity, and number of components than have heretofore been required to recover FSK modulated signals in electronic identification systems.

A schematic diagram of the preferred embodiment of the FSK detector circuit 21 is shown in FIG. 10. The FSK detector circuit 21 is realized using as few as two operational amplifiers and eleven discrete components including five capacitors, five resistors, and a diode.

The amplifier circuit 24' of FIG. 10, is adapted to receive an FSK modulated input signal 23 (See FIG. 9a) and produce a signal 25 that is amplitude modulated as well as FSK modulated (See FIG. 9b). As seen in FIG. 10, the amplifier circuit 24' preferably includes a band pass amplifier consisting of an operational amplifier U1 having a feedback loop formed with a pair of capacitors, C9 and C10, and a pair of resistors, R9 and R10. Alternatively, a high-pass amplifier, a low pass amplifier, or band-elimination amplifier can be used so long as the gain in the amplifier is frequency dependent and the passive components of the amplifier circuit 24' are selected so that one of the FSK frequencies is amplified more than the other FSK frequency.

The diode detector shown in FIG. 10, is a simple diode peak detector circuit 26' consisting of a single diode D2 coupled to a parallel connected capacitor C11 and resistor R11. This simple diode peak detector circuit 26' is particularly adapted to remove the carrier portion of the AM/FSK modulated signal 25 output from the amplifier circuit 24'. The output signal 27 of the diode peak detector circuit 26' (See FIG. 9c) is representative of the positive peaks of the AM/FSK modulated signal.

Two parallel outputs of the diode peak detector circuit 26' are coupled to a comparator circuit 28'. The comparator circuit 28' includes an operational amplifier U2 having one input being the filtered output 27 of the peak detector circuit 26'. This peak detector signal 27 is filtered using a low-pass filter arrangement of resistor R12 and capacitor C12 to remove residual components of the carrier without significantly attenuating the amplitude of the signal 27. The other input to the operational amplifier U2 is a highly filtered signal 33 from the peak detector circuit 26' which functions as the reference signal 33 (See FIG. 9d) for the comparator circuit 28'. Resistor R13 and capacitor C13 form another low-pass filter disposed between the peak detector circuit 26' and the operational amplifier U2. The values of resistor R13 and capacitor C13 are selected to achieve the desired level of attenuation suitable for the reference signal 33. The operational amplifier U2 thus compares the filtered signal 27 against the reference signal 33 and produces a logic level output signal 29 (See FIG. 9e) that is a digital representation of the information on the original input FSK modulated signal 23.

An important feature of the detector circuit is its simplicity. Furthermore, by making a few minor changes to the amplifier circuit, the low cost electronic identification apparatus can be used with different transponders made by various manufacturers which use different identification frequencies.

Microprocessor Controller

The microprocessor 30, in the preferred embodiment, is realized using a commercially available EPROM-based 8-Bit CMOS Microcontroller, such as the PIC16C5x series available from Microchip Technology, Inc. Such device is of the RISC (Reduced Instruction Set Computer) variety, which means it uses fewer instructions and each instruction is very fast. The RISC-like language used with the PIC16C5x series of devices includes only 33 single word instructions. Almost all of these instructions, except for program branches (which are two-cycle operations), take only a single cycle, thereby making the PIC16C5x processor very fast and very efficient. Because of the low processing demands placed on the microprocessor in the present embodiment, it is contemplated that many other microprocessors, preferably low end and low cost microprocessors that are widely available from Motorola, Intel and other manufacturers could be used.

I/O Interface

For some applications, the output data stream of the microprocessor controller, may also need to be level shifted in an I/O interface circuit to comply with whatever standard protocol is being used; such as, but not limited to, RS-232, RS-485, Weigand wire etc. Thus, an I/O interface circuit is used which may be of conventional design and may be realized using commercially available I/O interface devices, such as the MAX 220-MAX249 Multi-Channel RS-232 Drivers/Receivers available from MAXIM.

The Complete Identification Device

Figure 11:
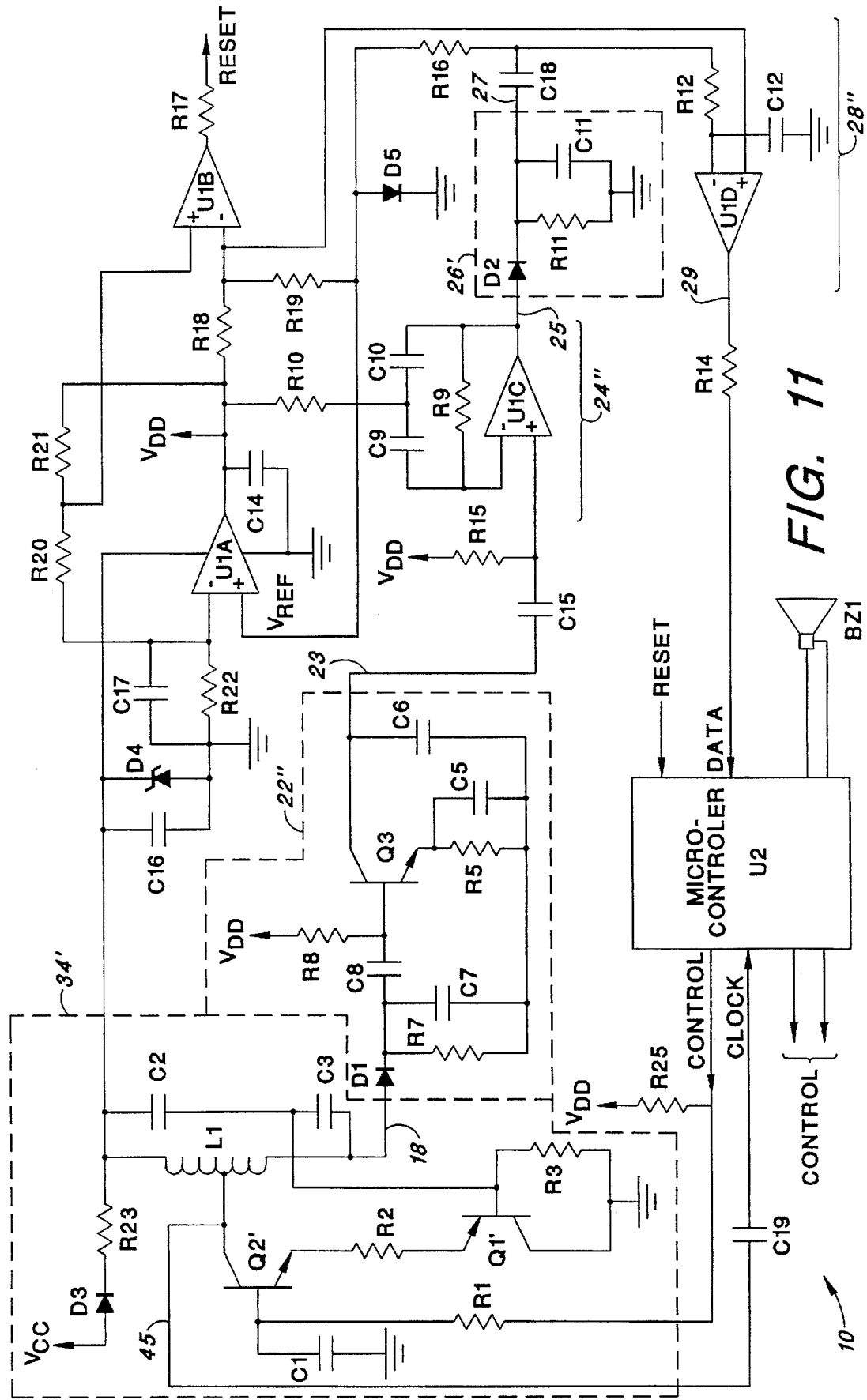
FIG. 11 shows a detailed electrical schematic diagram of the electronic identifier apparatus of the present invention.

A schematic diagram of a preferred embodiment of one embodiment of a complete identification device 10 is shown in FIG. 11. Such schematic diagram, in general, parallels the above-described descriptions of the individual circuits used within the device 10, and corresponding components or elements within FIG. 11 have the same reference numerals as used elsewhere in this application. For the most part, the schematic diagram in FIG. 11, given the previous descriptions, is self-explanatory and should be readily understood by those of skill in the art. However, there are some differences in FIG. 11 from the circuits previously described which illustrate alternate circuits that may be used to practice the invention.

For example, in FIG. 11, it is seen that the modified Colpitts oscillator, shown generally within the dotted line 34', comprises an NPN transistor Q2' and a PNP transistor Q1' that are configured to sink current rather than to source current as is done in FIG. 3 with the corresponding NPN transistor Q1 and the PNP transistor Q2. Like the oscillator circuit 34 of FIG. 3, it is seen that the oscillator circuit 34' of FIG. 11 provides a clock signal 45 that is tapped off of the collector of transistor Q2' at the point where such transistor taps into the coil L1. In FIG. 11, such clock signal is provided to a microcontroller circuit U2 through a coupling capacitor C19.

One of the advantages of clocking the microcontroller U2 from the oscillator 34' is that the oscillator 34' is able to do double duty—generate a clock signal as well as a provide a carrier signal that is applied to the coil L1 (and thus coupled into the transponder device). Such double duty reduces the number of components required. Because of such double duty, however, it is necessary to provide pull-up resistor R25 so that the oscillator 34' is still enabled (by applying a driving voltage to the base of transistor Q2', even when the microcontroller U2 may be put in a standby, or "sleep" state. Thus, when it is time to wake up the microcontroller U2, e.g., after a suitable timed delay, there will be a clock signal available to effectuate the wake up.

Another advantage of clocking the microcontroller U2 directly from the oscillator 34' is that the software of the microcontroller may be written utilizing the fact that the microcontroller operation will always be synchronized with the oscillator output (antenna) signal.

Still referring to FIG. 11, it is seen that the oscillator output signal 18, which includes both the carrier signal generated by the oscillator 34' as well as any reflected identification/data signal received from the transponder circuit, is fed into an enhanced peak detector circuit 22". The function of the enhanced peak detector circuit 22" shown in FIG. 11 is to extract the returned identification/data signal from the carrier signal. The peak detector circuit 22" shown in FIG. 11 is identical to the enhanced peak detector circuit described previously in connection with FIG. 7. However, it is to be noted that any suitable peak detector circuit may be used to perform the extraction function of the peak detector circuit 22". Thus, for example, the circuits of FIGS. 4 or 6, respectively, could be used as the peak detector 22". Similarly, for some applications of the present invention, a conventional peak detector circuit, e.g., as shown by the circuit 22* in FIG. 12, may be used to perform the desired extraction function. Indeed, one of the advantages of the present invention is the flexibility that exists relative to substituting one particular type of circuit for another as a function of a given application.

As seen in FIG. 11, after the returned identification/data signal has been extracted, it is presented to a amplifier/filter circuit 24", a peak detector circuit 26', and a comparator circuit 28". The amplifier/filter circuit 24" comprises op amp U1C, with resistors R9 and R10, and capacitors C9 and C10, in its feedback path. The only difference between the circuit 24' included in FIG. 11, and the circuit 24' described previously in connection with FIG. 10, is that the resistor R10 in FIG. 11 is connected to the source voltage $V_{DD}$, while the resistor R10 in FIG. 10 is grounded. Such difference is necessitated only because of the biasing scheme used by the circuits of FIG. 11. For ac signal analysis/function purposes, there is no difference between grounding R10 or connecting it to the supply voltage $V_{DD}$.

The peak detector circuit 26' of FIG. 11 is the same as the peak detector circuit 26' described previously in connection with FIG. 10.

The comparator circuit 28" shown in FIG. 11 differs from the comparator circuit 28' described previously in connection with FIG. 10 only in the manner in which the reference voltage, applied to the positive ("+") terminal of op amp U1D, is derived. Such reference voltage for the circuit 28" in FIG. 11 is obtained from a reference diode D5, which is biased through resistors R18 and R19 connected to the $V_{DD}$ supply voltage. Thus, at normal temperatures, this reference voltage will be approximately +0.45 to +0.55 vdc. The reason such reference voltage is applied to the positive input terminal of the op amp U1D is to drive the output of the comparator circuit 28" in one direction (positive) in the absence of data appearing at the negative input terminal of U1D. A further difference between the comparator circuit 28" of FIG. 11 and the equivalent circuit 28' shown in FIG. 10 is that a coupling capacitor C18 is used in FIG. 11 to ac couple the data signal 27 to the negative input terminal of op amp U1D.

In FIG. 11, four operational amplifiers (op amps) are used: U1A, U1B, U1C, and U1D. Only op amps U1C and U1D correspond to circuits described previously. That is, op amp U1C functions as the amplifier/filter circuit 24", and op amp U1D functions as the comparator circuit 28". Op amp U1A is used as a voltage regulator to convert the raw input voltage $V_{CC}$ to a more stable voltage $V_{DD}$. The voltage $V_{DD}$ need not be a precise voltage, but typically needs to be maintained between about 3 to 5 vdc. (Such voltage $V_{DD}$ is used by the microcontroller U2). Hence, by coupling the reference voltage $V_{REF}$ to the positive input terminal of op amp U1A (obtained from the reference diode D5), and by fashioning an appropriate ratio of feedback resistors R20 and R21 with resistor R22, an output voltage $V_{DD}$ is provided that is maintained at about 4.0 vdc. Capacitor C17 across resistor R22 helps to provide stability to the feedback voltage, and capacitor C14 is used to reduce ripple on the output voltage $V_{DD}$.

For the embodiment shown in FIG. 11, the raw input voltage $V_{CC}$ is assumed to be somewhat greater than the voltage $V_{DD}$ needed by the microcontroller and other circuits, and may be significantly less stable and subject to transients. Hence, capacitor C16 and zener diode D4 help smooth out and/or clamp any significant spikes or voltage transients that may be present on $V_{CC}$. In one embodiment of the invention, $V_{CC}$ is 12 vdc.

The other op amp U2B is used as a low voltage detector to detect whenever $V_{DD}$ drops below a prescribed threshold, e.g., 3 vdc. If $V_{DD}$ does drop below the threshold, then a reset signal is generated that resets the microcontroller. The low voltage threshold is set by the resistor divider network comprised of resistors R20 and R21 in the feedback loop of op amp U1A, while the $V_{DD}$ voltage is monitored through the resistor divider network comprised of resistors R18 and R19.

Advantageously, using op amps U1A and U1B to provide the voltage regulation and low voltage threshold sensing functions does not result in a significant increase in parts count of the identifier device 10. This is because four op amps come in the same IC package, i.e., a quad op amp package, such as the LM324AM manufactured by, e.g., National Semiconductor.

As seen in FIG. 11, including the microprocessor controller U2, the entire electronic identifier apparatus shown in FIG. 11 may be realized using a very low number of integrated circuit chips, resistors, capacitors, inductors, transistors, etc. In one embodiment of the invention, the entire identifier apparatus may be fabricated using a total of about 26 discrete components, arranged to fit on a circuit board having dimensions of only about 3.6 by 1.85 inches (about 9 by 4.7 cm).

It is thus apparent that the present invention provides a simple and inexpensive electronic identifier that provides a significant savings in terms of expense, circuit complexity, and number of components than have heretofore been required for similar such devices.

The present invention and its advantages will be understood from the foregoing description, and it will be apparent that numerous modifications and variations could be made thereto without departing from the spirit and scope of the invention or sacrificing all of its material advantages, the forms hereinbefore described being merely exemplary embodiments thereof.

To that end, it is not intended that the scope of the invention be limited to the specific embodiments illustrated and described. Rather, it is intended that the scope of the invention be determined by the appended claims or their equivalents.

What is claimed is:

1. An oscillator circuit comprising:

a first transistor;

a second transistor coupled to the emitter of the first transistor;

the first and second transistors being operatively coupled to a supply voltage; and a positive feedback means comprising a parallel LC circuit coupled to the collector of the first transistor, the LC circuit having a resonant frequency, and wherein a capacitance of the parallel LC segment includes at least two capacitors in series forming a capacitive divider which provides a low impedance feedback via the base of the second transistor into the emitter of the first transistor, and further wherein an inductance of the LC circuit comprises an antenna coil; and wherein an output signal appears across the antenna coil having a frequency substantially equal to the resonant frequency and having an amplitude that is as high as a factor of 20 times the supply voltage while maintaining a high Q, low distortion output; and further wherein an output clock signal may be extracted from the collector of the first transistor, the output clock signal having an amplitude that is less than the amplitude of the output signal by a prescribed amount.

2. The oscillator circuit of claim 1 further including biasing means coupled to the base of the first transistor.

3. The oscillator circuit of claim 2 wherein the biasing means comprises a capacitor and resistor connected in parallel.

4. The oscillator circuit of claim 3 wherein the antenna coil includes a tap point, and wherein the collector of the first transistor taps into the antenna coil at the tap point, whereby the position of the tap point determines, at least in part, the amplitude of the clock signal.

5. The oscillator circuit of claim 1 wherein the first and second transistors comprise bipolar transistors.

6. The oscillator circuit of claim 5 wherein the first transistor comprises an NPN transistor and the second transistor comprises a PNP transistor.

7. The oscillator circuit of claim 5 wherein the first transistor comprises a PNP transistor and the second transistor comprises an NPN transistor.

8. The oscillator circuit of claim 1 wherein all of the elements of the oscillator circuit are realized using no more than nine discrete components.

9. An oscillator circuit consisting of:

a first transistor;

a second transistor coupled to the first transistor;

the first and second transistors being operatively coupled to a supply voltage;

an LC circuit coupled to provide positive feedback between the first and second transistors, the LC circuit consisting of first and second capacitors connected in series forming a capacitive divider network, which capacitive divider network is connected in parallel with a coil having an inductance, the value of the inductance and the value of capacitance of the first and second capacitors in series determining a resonant frequency at which the oscillator circuit oscillates, the capacitive divider network providing a low impedance feedback via the second transistor to the first transistor, the first and second transistors each comprising bipolar transistors, each having a base, a collector and an emitter, and wherein the emitter of the second transistor is connected to the emitter of the first transistor via a first resistor, and wherein the LC circuit is coupled between the collector of the first transistor and the base of the second transistor, and a bias network comprising a third capacitor and a second resistor coupled to the first transistor;

whereby the oscillator circuit produces a high Q, low distortion output signal in the coil.

10. The oscillator of claim 9 wherein the base of the second transistor connects with the series connection of the first and second capacitors at the point where the first capacitor is connected with the second capacitor.

11. The oscillator of claim 9 wherein the first transistor comprises a PNP transistor, and the second transistor comprises an NPN transistor.

12. The oscillator of claim 9 wherein the first transistor comprises an NPN transistor, and the second transistor comprises a PNP transistor.

* * * * *